(12) United States Patent
DeYoung et al.

(10) Patent No.: US 7,410,751 B2
(45) Date of Patent: Aug. 12, 2008

(54) COMPOSITIONS AND METHODS FOR IMAGE DEVELOPMENT OF CONVENTIONAL CHEMICALLY AMPLIFIED PHOTORESISTS

(75) Inventors: James DeYoung, Durham, NC (US); Mark Wagner, Raleigh, NC (US)

(73) Assignee: Micell Technologies, Inc., Raleigh, NC (US)

( * ) Notice: Subject to any disclaimer, the term of this patent is extended or adjusted under 35 U.S.C. 154(b) by 205 days.

(21) Appl. No.: 11/045,791

(22) Filed: Jan. 28, 2005

(65) Prior Publication Data

US 2006/0172144 A1 Aug. 3, 2006

(51) Int. Cl.
*G03C 5/18* (2006.01)
(52) U.S. Cl. ...................................... 430/431
(58) Field of Classification Search ................. 430/311, 430/270.1, 431
See application file for complete search history.

(56) References Cited

U.S. PATENT DOCUMENTS

| | | | | |
|---|---|---|---|---|
| 4,377,710 A | * | 3/1983 | Seale et al. ................. | 564/281 |
| 5,532,106 A | | 7/1996 | Fréchet et al. | |
| 5,532,113 A | | 7/1996 | Fréchet et al. | |
| 5,536,616 A | | 7/1996 | Fréchet et al. | |
| 5,545,509 A | | 8/1996 | Cameron et al. | |
| 5,648,196 A | | 7/1997 | Fréchet et al. | |
| 5,665,527 A | | 9/1997 | Allen et al. | |
| 5,773,190 A | | 6/1998 | Oie et al. | |
| 5,866,005 A | * | 2/1999 | DeSimone et al. .......... | 210/634 |
| 5,944,996 A | * | 8/1999 | DeSimone et al. .......... | 210/634 |
| 6,001,418 A | | 12/1999 | DeSimone et al. | |
| 6,083,565 A | | 7/2000 | Carbonell et al. | |
| 6,306,555 B1 | | 10/2001 | Schulz et al. | |
| 6,379,874 B1 | | 4/2002 | Ober et al. | |
| 6,576,392 B1 | | 6/2003 | Sato et al. | |
| 6,610,456 B2 | | 8/2003 | Allen et al. | |
| 6,737,215 B2 | | 5/2004 | Dammel et al. | |
| 6,737,225 B2 | * | 5/2004 | Miller ........................ | 430/329 |
| 6,753,129 B2 | | 6/2004 | Livesay et al. | |
| 6,764,809 B2 | | 7/2004 | DeSimone et al. | |
| 6,787,286 B2 | | 9/2004 | Szmanda et al. | |
| 6,858,379 B2 | | 2/2005 | Zampini et al. | |
| 6,919,167 B2 | * | 7/2005 | DeYoung et al. ............ | 430/313 |
| 6,929,904 B2 | * | 8/2005 | DeSimone .................. | 430/331 |
| 7,044,143 B2 | * | 5/2006 | DeYoung et al. ............ | 134/105 |
| 7,044,376 B2 | * | 5/2006 | Nelson et al. ............... | 235/454 |

(Continued)

OTHER PUBLICATIONS

International Search Report and Written Opinion for International Application No. PCT/US2006/03156, mailed Jun. 27, 2006.

(Continued)

*Primary Examiner*—Cynthia H. Kelly
*Assistant Examiner*—Connie P Johnson
(74) *Attorney, Agent, or Firm*—Myers Bigel Sibley & Sajovec

(57) ABSTRACT

Methods for carrying out lithography with a carbon dioxide development system are described. In some embodiments the methods involve preferential removal of a darkfield region; in other embodiments the methds involve preferential removal of a light field region. The carbon dioxide development systems include a quaternary ammonium salt, preferably a quaternary ammonium hydroxide, halide, or carbonate. Compositions for carrying out the methods are also described. The quaternary ammonium salts preferably contain at least one $CO_2$-philic group, such as a siloxane-containing group or a fluorine-containing group.

8 Claims, 1 Drawing Sheet

Scanning Electron Microscope (SEM) image of supercritical $CO_2$ developed DUV photoresist using $CO_2$-philic ammonium salts

U.S. PATENT DOCUMENTS

| | | | |
|---|---|---|---|
| 2002/0119398 A1 | 8/2002 | DeSimone et al. | |
| 2003/0047533 A1 | 3/2003 | Reid et al. | |
| 2004/0091813 A1* | 5/2004 | Poss et al. | 430/270.1 |
| 2004/0096210 A1 | 5/2004 | Takasu et al. | |
| 2004/0096779 A1 | 5/2004 | DeSimone | |
| 2004/0096783 A1 | 5/2004 | DeYoung et al. | |
| 2005/0008976 A1 | 1/2005 | Sakamizu et al. | |
| 2005/0008980 A1 | 1/2005 | Arena-Foster et al. | |
| 2005/0170277 A1* | 8/2005 | Zannoni et al. | 430/270.1 |
| 2005/0215746 A1* | 9/2005 | DeSimone et al. | 526/942 |
| 2005/0227183 A1* | 10/2005 | Wagner et al. | 430/311 |
| 2006/0003271 A1* | 1/2006 | Clark et al. | 430/329 |

OTHER PUBLICATIONS

Cameron, James F., et al., Photogeneration of amines from α-keto carbamates: design and preparation of photoactive compounds, *J. Chem. Soc.*, 1:2429-2442 (1997).

Fréchet, Jean M.J., et al., Photogenerated Base in Resist and Imaging Materials: Design of Functional Polymers Susceptible to Base Catalyzed Decarboxylation, *Chem. Mater.*, 9: 2887-2893 (1997).

Havard, Jennifer M., et al., Functional Design of Environmentally enhanced Water-Soluble Positive-Tone Photoresists, *Polym. Mat. Sci. Eng.*, 77:424-5 (1997).

Jackson et al., *Surfactants and Microemulsions in Supercritical Fluids*; in Supercritical fluid cleaning; ed.J.Hardy (Noyes) 1998, ch. 5 pp. 87-120.

Pham, Victor Q., et al., Positive-Tone Resist for Supercritical $CO_2$ Processing, *Polymer Preprints*, 43(2): 885-6 (2002).

Sunderarajan et al., Supercritical CO2 processing for submicron imaging of fluropolymers, *Chem. Mater.*, 12 41-48 (2000).

Urankar, Edward J., et al., Photogenerated Base in Polymer Curing and Imaging: Design of Reactive Styrenic Copolymers Susceptible to a Base-Catalyzed β-Elimination, *Journal of Polymer ScienceJournal of Polymer Science: Part A: Polymer Chemistry*, 35:3543-3552 (1997).

Urankar, Edward J., et al., Photogenerated Base in Polymer Curing and Imaging: Cross-Linking of Base-Sensitive Polymers Containing Enolizable Pendant Groups, *Chem. Mater.*, 9: 2861-2868 (1997).

Urankar, Edward J., et al., Base-Sensitive Polymers as Imaging Materials: Radiation-Induced β-Elimination To Yield Poly(4-hydroxystyrene), *Macromolecules*, 30: 1304-1310 (1997).

\* cited by examiner

Scanning Electron Microscope (SEM) image of supercritical $CO_2$ developed DUV photoresist using $CO_2$-philic ammonium salts

COMPOSITIONS AND METHODS FOR IMAGE DEVELOPMENT OF CONVENTIONAL CHEMICALLY AMPLIFIED PHOTORESISTS

FIELD OF THE INVENTION

The present invention concerns lithographic methods, which may be used to form patterned regions on substrates such as microelectronic substrates.

BACKGROUND OF THE INVENTION

In photolithography using chemically amplified resists, the area of photoresist film exposed to incident radiation undergoes a chemical transformation. For most resists systems designed for traditional aqueous base development, this transformation results in a significant increase in polarity. For these systems, traditionally termed positive tone resist systems, the exposed region is removed during development in aqueous base. Alternatively, for negative tone resists systems the exposed region becomes less polar, and/or increases in molecular weight through cross-linking reactions upon exposure to radiation making this region less soluble in the developer solution. For negative tone systems the non-exposed region is preferentially removed in the developer solution.

Aqueous solutions of tetramethyl ammonium hydroxide TMAH are typically used as the photoresist developer. In order for development in aqueous base to be effective, the base must deprotonate a certain number of Bronsted acid groups to allow the resist to become soluble. The amount of deprotonation required for photoresist solubility is known as the critical ionization level, and has been well described in the literature (see G. Willson, et al. J. Vac. Sci. Technol. B 20(2) March/April 2002, 537-543.)

Feature sizes on microelectronic devices continue to shrink as these devices become smaller, faster and more powerful. The lithographic development of these smaller feature sizes in aqueous base can become problematic due to image collapse caused by the capillary forces and surface tension of water. Current approaches to solving this problem include IPA vapor drying and bilayer resist technology The prevention of image collapse in supercritical $CO_2$ dryers for MEMs and other applications is based on the absence of surface tension in supercritical $CO_2$ to avoid surface tension and capillary forces. The low or non-existent surface tension and tunable physical properties of densified $CO_2$ in the liquid or supercritical state makes it an attractive solvent replacement for microelectronic device processing. Each of these potential solutions for image collapse requires additional steps in the lithographic process leading to higher cost of ownership and decreased device yield.

Commercially available photoresists used for 248-nm lithography, 193-nm lithography, e-beam lithography, and those being developed for EUV-based lithography are not soluble in liquid or supercritical carbon dioxide in the exposed or unexposed state making $CO_2$-based development extremely challenging. Furthermore, Bronsted bases such as TMAH are neutralized in supercritical carbon dioxide which acts as a weak acid. As such, a pH above 7 is not readily accessible in $CO_2$ based systems. Under these conditions, the minimum level of ionization needed to dissolve exposed positive tone photoresist is not achievable.

In carbon dioxide solvent systems, low-polarity polymer species, specifically fluorinated polymers and siloxane-containing polymers are more soluble than polar polymers. This provides an obvious pathway for negative tone image development, as seen in U.S. Pat. No. 5,665,527 to Allen and U.S. Pat. No. 6,379,874 to Ober. However, for Allen and Ober, image transfer in the negative tone using dense CO2 utilizes non-commercial and in some cases impractical fluorinated or siloxane-containing polymers that are not proven resist systems and are unlikely to be adopted by the microelectronics industry.

It would be extremely desirable to have a means to realize the benefits of a zero-surface tension fluid like supercritical carbon dioxide in a $CO_2$-based development system that is compatible with tradition 248-nm, 193-nm, e-beam, and EUV-based resists.

SUMMARY OF THE INVENTION

A first aspect of the invention is a method for carrying out lithography with a carbon dioxide development system, comprises the steps of: (a) providing a substrate (e.g., a microelectronic substrate), the substrate having a polymer resist layer formed thereon, (b) exposing at least one portion of the polymer resist layer to radiant energy (e.g., EUV light) causing a chemical shift to take place in the exposed portion and thereby form at least one light field region in the polymer resist layer while concurrently maintaining at least one portion of the polymer layer unexposed to the radiant energy to thereby form at least one dark field region in the polymer resist layer; (c) optionally baking the polymer resist layer; (d) depositing on the polymer resist layer a developing composition (e.g., a liquid or supercritical fluid) comprising or consisting essentially of (i) a quaternary ammonium salt, (ii) optionally, an organic cosolvent, (iii) water, and (iv) optionally, a $CO_2$-philic surfactant; and then (e) rinsing the developing composition from the polymer resist layer with a carbon dioxide rinse solution so that at least one light field region is preferentially removed from the substrate by the carbon dioxide rinse solution as compared to the at least one dark field region.

A further aspect of the invention is a developing composition (e.g., a liquid or supercritical fluid) comprising or consisting essentially of: (i) a quaternary ammonium salt, (ii) optionally, an organic cosolvent, (iii) water, and (iv) optionally, a $CO_2$-philic surfactant. Such a composition is useful in carrying out the methods described above. In some embodiments the quaternary ammonium salt is a quaternary ammonium hydroxide. In some embodiments the quaternary ammonium salt has at least one $CO_2$-philic group coupled thereto. In some embodiments the quaternary ammonium salt is a compound of the formula: $(R^1)(R^2)(R^3)(R^4)N^+OH^-$, wherein: $R^1$, $R^2$, $R^3$ and $R^4$ are each independently selected from the group consisting of $R_o$— and $R_f$—, $R_o$ comprises an organic group; $R_f$ comprises a $CO_2$-philic group and optionally a non-fluorinated spacer group linking the $CO_2$-philic group and N; subject to the proviso that at least one of $R^1$ through $R^4$ is $R_f$. In some embodiments $R_o$ is an aromatic or aliphatic group. In some embodiments $R_f$ comprises a moiety selected from the group consisting of perfluoroalkyl or perfluoroaryl. In some embodiments $R_f$ comprises a non-fluorinated aromatic or aliphatic linking group.

A further aspect of the invention is a method for carrying lithography with a carbon dioxide development system, comprising the steps of: (a) providing a substrate (e.g., a microelectronic substrate), the substrate having a polymer resist layer formed thereon, (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy (e.g., EUV light) to thereby form at least one dark field region in the polymer resist layer; (c) optionally baking the polymer resist layer; and then (c) contacting the polymer resist layer to a carbon dioxide solvent system (e.g., a liquid or supercritical fluid), the solvent system comprising or consisting essentially of carbon dioxide having a quaternary ammonium salt dispersed therein, under conditions in which the at least one dark field region is preferentially removed from the substrate by the carbon dioxide solvent system as compared to the at least one light field region.

A further aspect of the invention is a carbon dioxide solvent system useful in carrying out a method as described above. In general the system comprises or consists essentially of carbon dioxide (e.g., as a liquid or supercritical fluid) having a quaternary ammonium salt dispersed therein. The quaternary ammonium salt is preferably selected from the group consisting of quaternary ammonium hydroxides, halides, alkoxides, borates, cyanates, carbonates, nitrates, sulfonates, sulfates, etc. In some embodiments the quaternary ammonium salt is a quaternary ammonium hydroxide; in some embodiments the quaternary ammonium salt is a quaternary ammonium halide; in some embodiments the quaternary ammonium salt is a quaternary ammonium carbonate. In some embodiments the quaternary ammonium salt has at least one $CO_2$-philic group coupled thereto. In some embodiments the quaternary ammonium salt is a compound of the formula: $(R^1)(R^2)(R^3)(R^4)NX$, wherein: $R^1$, $R^2$, $R^3$ and $R^4$ are each independently selected from the group consisting of $R_o$— and $R_f$—, $R_o$ comprises an organic group; $R_f$ comprises a $CO_2$-philic group and optionally a non-fluorinated spacer group linking the $CO_2$-philic group and N; X is selected from the group consisting of hydroxy, halo, carbonate, and alkoxy; subject to the proviso that at least one of $R^1$ through $R^4$ is $R_f$. In some embodiments $R_o$ comprises an aromatic or aliphatic group; in some embodiments $R_f$ comprises perfluoroalkyl or perfluoroaryl; in some embodiments $R_f$ comprises an aromatic or aliphatic linking group.

DETAILED DESCRIPTION OF THE PREFERRED EMBODIMENTS

Figure 1:
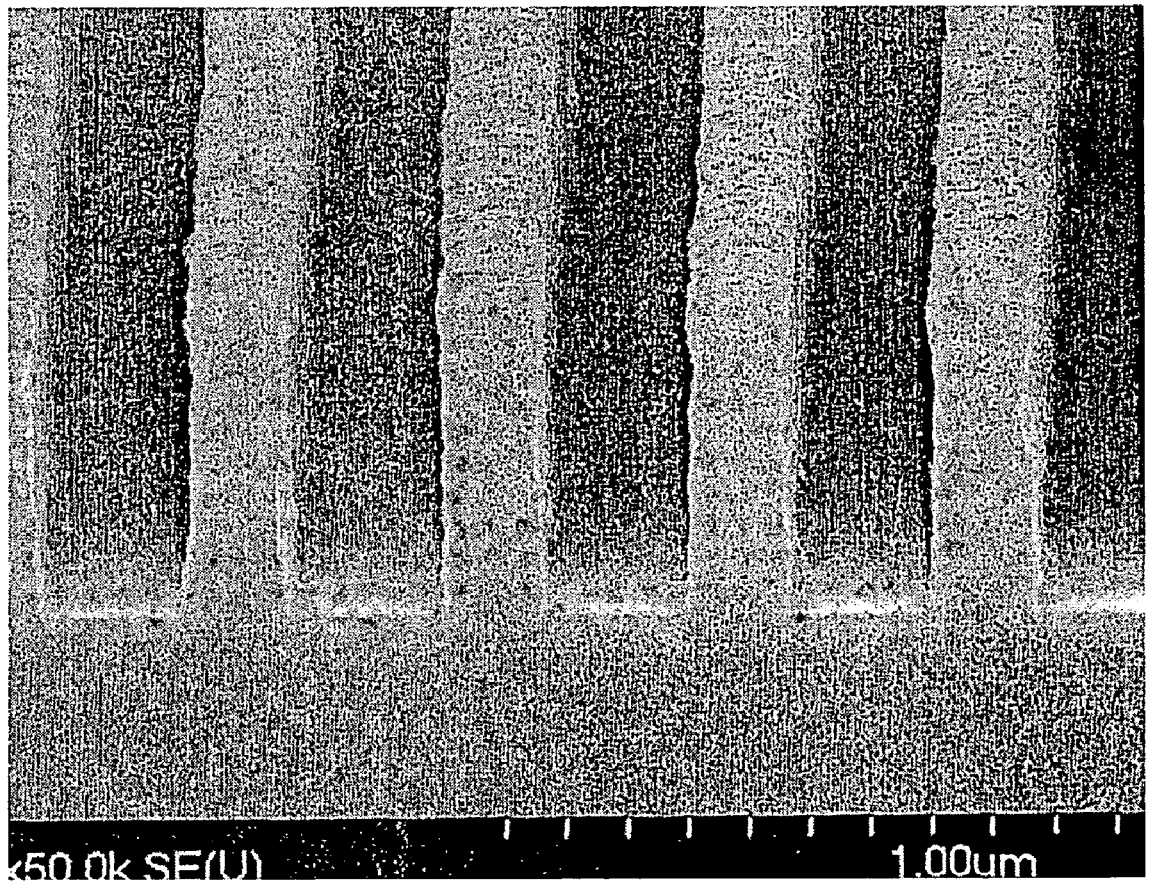
FIG. 1 is a Scanning Electron Microscope (SEM) image of supercritical $CO_2$ developed DUV photoresist using $CO_2$-philic ammonium salts.

The present invention is explained in greater detail in the specification set forth below. Applicants specifically intend that the disclosures of all United States patent references that are cited herein be incorporated herein by reference in their entirety.

1. Substrates and Coatings

The present invention may be carried out on a variety of substrates in which lithographic patterning is used to define features during the manufacturing process. As such, the invention may be used in the manufacture of semiconductors, miroelectromechanical devices (MEM's), optoelectronics, etc. The present invention can be carried out on substrates for these devices including silicon, germanium, gallium aresenide, indium phosphide, cadmium sulfide, zinc oxide, etc.

Photochemically active resists may be applied by spin coating from solvent or other suitable technique. The resist typically comprises a polymeric material, and may be a positive-acting resist or a negative-acting resist. Any suitable resist composition can be used in conjunction with the present invention, including but not limited to those described in U.S. Pat. Nos. 6,165,678; 6,103,866; 6,042,997; 5,989,776; 5,922,518; 5,866,304; 5,492,793; 5,443,690; 5,071,730; 4,980,264; and 4,491,628.

For example, in some embodiments the resist composition includes a photosensitive acid generator. Upon exposure to radiation, the radiation-sensitive acid generator generates a strong acid. A variety of photosensitive acid generators can be used in the composition. Generally, suitable acid generators have a high thermal stability (preferably to temperatures greater than 160° C.) so they are not degraded during pre-exposure processing. Suitable acid generators include ionic iodonium sulfonates, e.g., diaryl iodonium (alkyl or aryl) sulfonate and bis-(di-t-butylphenyl)iodonium camphanylsulfonate; aryl (e.g., phenyl or benzyl) triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; trifluoromethanesulfonate esters of hydroxyimides, alpha,alpha'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), Chemistry of Materials 3:395. Additional suitable acid generators useful in conjunction with the compositions and methods of the invention will be known to those skilled in the art and/or described in the pertinent literature (see U.S. Pat. No. 6,165,678).

The resist composition may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The resist composition may additionally, if necessary or desirable, include additional materials (known to those skilled in the art) such as antireflective layers. The resist composition may also contain additional materials such as second thin film layers creating multi-layer resist compositions typically used to enhance etch resistance.

2. Quaternary Ammonium Salts

The quaternary ammonium salts useful in the current invention are as a class soluble in dense carbon dioxide (liquid or supercritical) at pressures between 500 psig and 10000 psig and temperatures between 0° C. and 100° C. Most preferred are salts soluble at pressures between 800 psig and 5000 psig at temperatures between 10° C. and 60° C.

The positively charged ion, represented by the formula $R^1R^2R^3R^4N^+$ preferably contains at least one organic group that is considered $CO_2$-philic. $CO_2$-philic groups can be partially or wholly fluorinated, or can consist of siloxane-based or siloxane-containing substituents. These '$R_f$' group can be aliphatic or aromatic in nature or be combinations of both moieties. Ideally, when the $CO_2$-philic group $R_f$ contains fluorine, the group is attached to the nitrogen center through a non-fluorinated linking group (e.g., $R_f$— is a group of the formula $R_aR_b$—, where $R_a$ is a fluorine-containing group and $R_b$ is a non-halogenated or non-fluorinated linking group). This is to minimize the inductive effect of fluorinated groups (a very electronegative atom) on the nitrogen. The prototypical $CO_2$-philic group $R_f$— is represented by the formula $R_aR_b$—, where $R_a$ is a perfluoroalkyl, perfluoroether, or perfluoroaryl group, and $R_b$ is a linking group, typically a C1-C6 aliphatic (linear, non-linear, branched, non-branched, saturated or non-saturated.), aromatic, or a C1-C6 hydrocarbon group such as —$CH_2CH_2CH_2$—, where the fluorocarbon group is attached to the linking group and the linking group is attached to the nitrogen such that the nitrogen is not directly attached to the fluorocarbon. In the case where the linking group $R_b$ is aromatic, a C6 aromatic group is favored. Preferably, the quaternary ammonium salt contains two or three $CO2$-philic groups, $R^1$, $R^2$, $R^3$, or $R^4$. Additional $CO2$-philic groups could be utilized such as silicone-based moieties and carbonyl-containing moieties such as acetate, ether carbonate. Typically, and preferably, one or more of the groups attached to the nitrogen is not a $CO_2$-philic group. Of the non-$CO_2$-philic groups, $R^1$ through $R^4$, typically one group is a C1-C6 aliphatic or C1-C6 hydrocarbon group such as a methyl, ethyl, propyl, butyl, or hexyl group.

The negatively charge ion, represented by the formula X—, is in some embodiments selected from a large group of negatively charged ions. The ion, X—, can be any atom or group of atoms capable of supporting and extra valence electron. Prototypical examples include: halides, (F, Cl, Br, I), oxides, carbonates, borates, cyanates, alkoxides, sulfides, phosphides, phosphates, and other organic and inorganic anions. The anion may or may not contain fluorine or fluorinated substituents.

Exemplary $CO_2$-philic groups may include a fluorine-containing segment or a siloxane-containing segment. The fluorine-containing segment is typically a fluorinated alkane (aliphatic) with between 1 and 20 carbon atoms, branched or non-branched. The fluorine-containing segment may also be aromatic or even polymeric in nature. As used herein, a "fluoropolymer" has its conventional meaning in the art and should also be understood to include low molecular weight oligomers, i.e., those which have a degree of polymerization greater than or equal to two. See generally Banks et al., Organofluorine Compounds: Principals and Applications (1994); see also Fluorine-Containing Polymers, 7 Encyclopedia of Polymer Science and Engineering 256 (H. Mark et al. Eds. 2d Ed. 1985). Exemplary fluoropolymers are formed from monomers which may include fluoroacrylate monomers such as 2-(N-ethylperfluorooctanesulfonamido)ethyl acrylate ("EtFOSEA"), 2-(N-ethylperfluorooctanesulfonamido) ethyl methacrylate ("EtFOSEMA"), 2-(N-methylperfluorooctanesulfonamido)ethyl acrylate ("MeFOSEA"), 2-(N-methylperfluorooctanesulfonamido)ethyl methacrylate ("MeFOSEMA"), 1,1'-dihydroperfluorooctyl acrylate ("FOA"), 1,1'-dihydroperfluorooctyl methacrylate ("FOMA"), 1,1',2,2'-tetrahydroperfluoroalkylacrylate, 1',2, 2'-tetrahydro perfluoroalkylmethacrylate and other fluoromethacrylates; fluorostyrene monomers such as alpha-fluorostyrene and 2,4,6-trifluoromethylstyrene; fluoroalkylene oxide monomers such as hexafluoropropylene oxide and perfluorocyclohexane oxide; fluoroolefins such as tetrafluoroethylene, vinylidine fluoride, and chlorotrifluoroethylene; and fluorinated alkyl vinyl ether monomers such as perfluoro(propyl vinyl ether) and perfluoro(methyl vinyl ether). Copolymers using the above monomers may also be employed. Exemplary siloxane-containing segments include alkyl, fluoroalkyl, and chloroalkyl siloxanes. More specifically, dimethyl siloxanes and polydimethylsiloxane materials are useful. Mixtures of any of the above may be used. See, e.g., U.S. Pat. Nos. 5,866,005; 6,270,531; 6,297,206. In some cases, organic acetates, including highly acetylated sugars, and ether-carbonate and polyether-carbonates may be used as $CO_2$-philic components.

3. Carbon Dioxide Solvent Systems

Carbon-dioxide solvent or development systems used to carry out the present invention typically comprise, consist of, or consist essentially of:

(a) a quaternary ammonium salt as described above, typically from 0.1, 0.5% or 1.5% to 10 or 20 percent by weight;

(b) carbon dioxide to balance, typically at least 40, 50 60, or 70 percent;

(c) optionally, where desired, from 0, 0.01, 0.1, 0.5, 1 or 2 percent to 5 or 10 percent or more of surfactant (preferably a $CO_2$-philic surfactant);

(d) optionally, where desired, from 0, 0.01, 0.1, 1 or 2 to 30, 40 or 50 percent or more of an organic co-solvent; and (e) optionally, and in some embodiments less preferably, from 0.01, or 0.1 to 2, 5 or 10 percent water (and in other embodiments 0 percent water).

Percentages herein are expressed as percentages by weight unless otherwise indicated.

The composition may be provided as a liquid or supercritical fluid, including cryogenic liquids. Liquid and supercritical carbon dioxide are herein together referred to as "densified" carbon dioxide in accordance with established usage.

The organic co-solvent may be one compound or a mixture of two or more ingredients. The organic co-solvent may be or comprise an alcohol (including diols, triols, etc.) including halogenated aliphatic or aromatic alcohols, ether, amine, ketone, carbonate, or alkanes, or hydrocarbon, or fluorocarbon (aliphatic or aromatic) The organic co-solvent may be a mixture of compounds, such as mixtures of alkanes as given above, or mixtures of one or more alkanes in combination with additional compounds such as one or more alcohols as described above. (e.g., from 0 or 0.1 to 5% of a C1 to C15 alcohol (including diols, triols, etc.)).

Any surfactant can be used to carry out the present invention, including both surfactants that contain a $CO_2$-philic group (such as described in PCT Application WO96/27704 or U.S. Pat. No. 5,783,082) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

Particular preferred embodiments of solvent systems that may be utilized herein are described in greater detail below.

4. Development Systems

In one embodiment of the invention, the polarity of the polymer resist in the light-field region is increased by the radiant energy. In another embodiment of the invention, the molecular weight of the polymer resist in the light-field region is decreased by the radiant energy. These changes are examples of a "chemical switch" or "chemical shift". Of course, the two processes (increased polarity, decreased molecular weight) may occur concurrently with one another upon exposure of the polymer resist to radiant energy.

The current invention discloses a new class of materials and dense carbon dioxide compositions useful in the image development of conventional chemically amplified photoresists in liquid or supercritical carbon dioxide. The development agents are generally defined as quaternary ammonium salts and are specifically CO2-soluble quaternary ammonium salts, or quaternary ammonium salts that are soluble or highly dispersable in predominantly dense CO2 fluids (i.e. the CO2 fluid may contain minority quantities of cosolvents, dispersants, surfactants or mixtures of adjuncts.) Additionally the current invention discloses new methods for image transfer using these agents in dense carbon dioxide to generate positive-tone and negative tone images.

In one embodiment, a composition containing dense CO2 and less than 5 mole percent of a CO2-soluble quaternary ammonium salt represented by the formula $(Rf)_2NMe_2^+ X^-$ (where Rf is $CF_3CF_2CF_2CF_2CF_2CF_2CH_2CH_2CH_2$ and where $X^-$ is $I^-$), is used to develop a 248-nm exposed wafer coated with a conventional positive tone DUV photoresist composition. In this case, termed "type A" development, the CO2 composition removes the non-exposed or "dark-field" region of the resist resulting in what may be termed "image reversal" of a conventionally positive tone resist. A representative example of a CO2-developed image using "type A" development is seen in FIG. 1. In another embodiment a composition containing less than 5 mole % of a quaternary ammonium salt represented by the formula $(Rf)_2NMe_2^+ X^-$ (where Rf is $CF_3CF_2CF_2CF_2CF_2CF_2CH_2CH_2CH_2$—, and where $X^-$ is $OH^-$), and water, optionally with wetting agents, surfactants, and cosolvents is used to develop a 248-nm exposed wafer coated with a conventional positive tone DUV photoresist composition. In this case, termed "type B" development, the "light field" region is preferentially removed from the wafer upon successive exposure of the wafer to dense CO2. Type B development can be described as positive tone development of conventional positive tone resists in dense carbon dioxide.

Hydroxyl ion containing quaternary ammonium bases such as TMAH used in conventional aqueous base development form basic solutions (pH above 7) in water or semiaqueous solutions and mixtures. In traditional positive tone photolithography, this is important to the development of the photoresist as traditional photopolymers are solubilized into aqueous solution selectively when they reach a "Critical Ionization" (CI) level. This mechanism for selective removal of imaged resist materials is well described in the literature (see G. Wilson et. al.). For the typical photopolymer to become sufficiently ionized and thus sufficiently removed at a reasonable rate in an aqueous environment, the pH of the solution needs to be above 10 and typically around 12 for most photopolymer systems in use. The two methods of application of the novel ammonium salts, type A and type B development, represent alternative pathways to selective removal of exposed photopolymers in CO2. One, Type B, is believed to be mechanistically analogous to the aqueous development described above and the other, Type A, is believed to present a mechanistically different alternative to achieving selective removal of non-exposed photoresist.

Without wishing to be bound to particular theory related to the mechanistic aspects related to type A and type B development of conventional resists in dense CO2 with novel quaternary ammonium salts, the following discussion is put forward to describe the function of the novel formulations toward image transfer.

Type A Development. Amorphous polymers including photoresist compositions are known to swell in supercritical carbon dioxide as this zero surface tension fluid readily permeates the free-volume voids of the typical polymer matrix (See for example: T. Toga et. al Europhysics Letters, 60 (4) 2002, 559-565). The degree of swelling is dependant on the chemical nature of the polymer and the fluid conditions (P,T). Highly amorphous low-polarity polymers with low cohesive energy densities are known to swell significantly even if they do not dissolve in the dense CO2. On the other hand, highly polar amorphous polymers with higher cohesive energy densities swell very little in CO2 as non-polar CO2 is incapable of breaking the inter- and intra-chain interactions. Additionally, in the case of the non-polar polymers, the transport of small molecules through the swollen polymer matrix is facilitated dramatically over the non-swollen polar polymer. In the context of a conventional positive tone chemically amplified photoresist, the non-exposed PR remains relatively non-polar as it's chemically active groups are typically protected with somewhat bulky non-polar groups. Conversely, the exposed portion of the positive tone photoresist becomes relatively more polar usually through protective group cleavage initiated by the incident light, photoacid generator, and post exposure bake. The increased polarity of the light field region in positive tone PR makes is much less likely to be affected by densified CO2 solutions due to reduced swelling and inhibited small molecule diffusion. For the non-exposed section of positive tone PR, it is likely to be swollen and affected by any chemistry dissolved in CO2 because it is relatively non-polar. In the case of Type A development, it is believed that the novel development agent is significantly more likely to interact with the non-exposed photoresist than the exposed as CO2 is much more suitable to wet and swell the relatively non-polar resist than the more polar exposed and deprotected resist.

Typical chemically amplified photoresists contain a mixture of protected and unprotected Bronsted acid functionality to enhance solubility in aqueous base. For instance a DUV resist might contain protected and unprotected hydroxy styrene groups. Following exposure and post-exposure bake, a majority of the protecting groups in the light field region are cleaved to give additional hydroxy styrene functionality in the exposed area. Bronsted acid functionality such as hydroxy styrene can react with the fluorinated ammonium base to form associative complexes that will enhance solubility in CO2. Because the exposed areas will contain more Bronsted acid groups, they are more likely to form associative complexes with the ammonium, relative to the unexposed region. However, as explained above, exposed areas are less likely to react with any CO2 soluble chemistry because they are more polar and will not swell and allow effective small molecule diffusion to take place. Thus, the association between Bronsted acid groups and fluorinated amonium salts in type A development is kinetically disfavored in the light field region and favored in the dark field areas, leading to the reverse image development observed.

Type B Development. Preferential removal of the exposed and deprotected photoresist, positive tone development, is accomplished in a stepwise fashion using the novel quaternary ammonium salts and dense CO2. In this case, the quaternary ammonium species is used as a hydroxide salt and formulated in an aqueous mixture that can include wetting agents, surfactants, and other formularies. An exposed wafer with a conventional positive tone resist is then exposed to this high pH mixture and development is initiated. This exposure can optionally be carried out in a relatively low density CO2 environment, however CO2 in the presence of water produces carbonic acid which will buffer the pH of the liquid formulation. At sufficiently high pH and after a sufficient period of time to allow for resist development to occur, dense CO2 is introduced into the chamber to remove the liquid developer formulation including the novel ammonium salt and water, leaving the developed image. Optionally, the developer solution can be substantially rinsed away from the surface of the wafer with an aqueous or semiaqueous formulation prior to addition of the dense CO2.

It is believed that type B development with these novel quaternary ammonium salts behaves mechanistically similar to aqueous based development as described above. The primary advantage of the $CO_2$ compatible ammonium salt over convention tetra-alkyl ammonium hydoxides such as tetramethylammonium hydroxide (TMAH) relates to the ability to remove the base in a low surface tension or zero surface tension fluid, provided by liquid and supercritical $CO_2$. TMAH and other analogous hydrocarbon ammonium salts are not soluble in $CO_2$.

5. Lithography Techniques

In general, photolithography involves the transfer of a design on a mask to a printed image in resist/photoresist material on a semiconductor substrate. There are a number of commonly recognized physical factors that contribute to differences between the design and the printed image. Lithography is well known and the steps thereof in the context of the present invention may be carried out by any suitable technique, including but not limited to those described in *Introduction to Microlithography*, Eds. Thompson et al. (Washington, D.C.: American Chemical Society, 1994), and in U.S. Pat. Nos. 6,383,719; 6,162,577; 5,780,188; 5,736,281; and 5,532,090.

In some embodiments, the process for generating a resist image on a substrate comprises the steps of: (a) coating a substrate with a film comprising the resist composition; (b) imagewise exposing the film to radiation/radiant energy; and (c) developing the image with a carbon dioxide solvent system as described herein The first step involves coating the substrate with a film comprising the resist composition dissolved in a suitable solvent. Suitable substrates include but are not limited to those described above. The substrate may or may not be coated with an organic anti-reflective layer prior to deposition of the resist composition. Preferably, the surface of the substrate is cleaned before the film is deposited thereon. In some embodiments, before the film has been exposed to radiation, the film is heated to an elevated temperature of about 90-150° C. for a short period of time, typically on the order of about 1 minute. In some embodiments the dried film may have a thickness of about 0.1-5.0 microns, or more particularly about 0.2-1.0 microns. In the second step of the process, the film is imagewise exposed to x-ray, electron beam, ultraviolet radiation/light (including deep ultraviolet light and extreme ultraviolet (EUV) light), or other source of radiant energ. The radiation is sufficient to initiate a chemical reaction in the resist film to increase the polarity thereof and/or decrease the molecular weight thereof (e.g., by generating free acid which causes cleavage of an acid-cleavable substituent and formation of the corresponding acid or alcohol or other base soluble functional groups. The carbon dioxide can serve to dilate or swell the polymer resist and hence obviate the need for a post exposure bake step, or a post exposure bake step may optionally be utilized in accordance with known techniques. The third step involves development of the image with a carbon dioxide solvent system as described above, utilizing the solvent systems described herein in a manner that preferentially removes either the exposed "light-field" region or the un-exposed "dark-field" region.

Dense phase carbon dioxide, liquid and supercritical $CO_2$ phases, have solvent properties that are significantly 'tuneable' over a large range of pressures and temperatures. Whereas conventional solvents and water may have density changes of <5% over a temperature range of 20° C. the density of liquid and supercritical $CO_2$ can change dramatically over the same range (e.g., 60% between 35° C. and 55° C. at 125 bar). The changes in fluid density as a function of pressure can also be significant as the pressure of supercritical $CO_2$ changes. At 55° C., the density of supercritical $CO_2$ fluid changes 125% between 100 and 200 bar. While fluid density does not completely account for the solubility or phase behavior properties of molecules in $CO_2$ fluid, it is a generally good indicator.

The substantial variance of fluid density over a relatively narrow range of T and P, provides process control factors not available to conventional fluids. The process control factors can be used to manipulate the phase behavior of a given material dissolved, dispersed, suspended, or otherwise carried in $CO_2$ fluid. This controlled manipulation can be very useful in the current invention. Consider the case where type B development is initiated. The initial role of the CO2 at a low density, if used at all, is simply to enhance the wetting of the substrate with the semi-aqueous formulation. After a sufficient period of time the fluid or gas, if initially below the critical pressure, density is raised to a point where the development formulation is dissolved or dispersed and carried away from the surface of the substrate. At this stage, the gradual expansion of the development fluid by CO2 helps minimize surface tension and viscosity that can damage delicate features.

The present invention is explained in greater detail in the following non-limiting Examples.

EXAMPLE 1

A chemically amplified positive tone photoresist with photoacid generator is coated onto a substrate and baked to remove residual solvent. The substrate is then exposed to incident light through a pattern transfer mask and then baked to complete hydrolysis of chemically active groups. Reverse image development of the pattern in $CO_2$ is then accomplished in the following manner. The substrate is placed in a pressure vessel heated to 50 C. On the bottom of the pressure vessel, not in contact with the substrate, is placed 500 mg of $(R_f)_2R_oNMe^+OH^-$, where Rf is $CF_3CF_2CF_2CF_2CF_2CF_2CH_2CH_2$ and $R_o$ is n-hexyl. Carbon dioxide is then added to the pressure vessel to 250 bar. The substrate is held at these pressure and temperature conditions for 15 minutes. A solution of carbon dioxide containing 3 ml of 2,2,3,3,4,4,5,5-octafluoro-1-pentanol is then pushed into the pressure vessel with simultaneous venting to maintain a pressure of 250 bar and a flow rate of 30 ml/min. Pure carbon dioxide is then rinsed through the system for an additional 5 fluid turnovers at 250 bar. The chamber is then vented and the substrate is removed to yield the reverse development image of the original pattern.

EXAMPLE 2

A chemically amplified positive tone photoresist with photoacid generator is coated onto a substrate and baked to remove residual solvent. The substrate is then exposed to incident light through a pattern transfer mask and then baked to complete hydrolysis of chemically active groups. Reverse image development of the pattern in $CO_2$ is then accomplished in the following manner. The substrate is placed in a pressure vessel at room temperature (23 C.). The vessel is then filled with a carbon dioxide solution containing 200 mg of $RfR_oNMe_2^+OH^-$ (where Rf is $CF_3CF_2CF_2CF_2CF_2CF_2CH_2CH_2CH_2$ and $R_o$ is an n-hexyl group) to a pressure of 85 bar. The substrate is held at these pressure and temperature conditions for 5 minutes. A solution of carbon dioxide containing 3 ml of 2,2,3,3,4,4,5,5-octafluoro-1-pentanol is then pushed into the pressure vessel with simultaneous venting to maintain a pressure of 85 bar and a flow rate of 30 ml/min. Pure carbon dioxide is then rinsed through the system for an additional 5 fluid turnovers at 85 bar. The chamber is then vented and the substrate is removed to yield the reverse development image of the original pattern.

EXAMPLE 3

A chemically amplified positive tone photoresist with photoacid generator is coated onto a substrate and baked to remove residual solvent. The substrate is then exposed to incident light through a pattern transfer mask and then baked to complete hydrolysis of chemically active groups. Reverse image development of the pattern in $CO_2$ is then accomplished in the following manner. The substrate is placed in a pressure vessel heated to 40 C. On the bottom of the pressure vessel, not in contact with the substrate, is placed 500 mg of $(Rf)_2R_oNMe^+$ $I^-$, where Rf is $CF_3CF_2CF_2CF_2CF_2CF_2CH_2CH_2CH_2$ and $R_o$ is an n-hexyl group. Carbon dioxide is then added to the pressure vessel to 250 bar. The substrate is held at these pressure and temperature conditions for 30 minutes. A solution of carbon dioxide containing 3 ml of 2,2,3,3,4,4,5,5-octafluoro-1-pentanol is then pushed into the pressure vessel with simultaneous venting to maintain a pressure of 250 bar and a flow rate of 30 ml/min. Pure carbon dioxide is then rinsed through the system for an additional 5 fluid turnovers at 250 bar. The chamber is then vented and the substrate is removed to yield the reverse development image of the original pattern.

EXAMPLE 4

A chemically amplified positive tone photoresist with photoacid generator is coated onto a substrate and baked to remove residual solvent. The substrate is then exposed to incident light through a pattern transfer mask and then baked to complete hydrolysis of chemically active groups. Reverse image development of the pattern in $CO_2$ is then accomplished in the following manner. The substrate is placed in a pressure vessel heated to 40 C. The vessel is then filled with a carbon dioxide solution containing 150 mg of $(Rf)_2NMe_2^+$ $X^-$ (where Rf is $CF_3CF_2CF_2CF_2CF_2CF_2CH_2CH_2CH_2$ and X is $OC(O)CF_2CF_3$) to a pressure of 85 bar. The substrate is held at these pressure and temperature conditions for 2 minutes Pure carbon dioxide is then rinsed through the system for an additional 5 fluid turnovers at 85 bar. The chamber is then vented and the substrate is removed to yield the reverse development image of the original pattern.

EXAMPLE 5

A chemically amplified positive tone photoresist with photoacid generator is coated onto a substrate and baked to remove residual solvent. The substrate is then exposed to incident light through a pattern transfer mask and then baked to complete hydrolysis of chemically active groups. Positive tone development (removal of light-field regions) is then accomplished in the following manner. The substrate is placed in a pressure vessel heated to 40 C. A liquid composition containing 5 mL of water, 500 mg of a hydrophilic wetting agent, 150 mg of $RfR_oNMe_2^+$ $OH^-$ (where Rf is $CF_3CF_2CF_2CF_2CF_2CF_2CH_2CH_2CH_2$ and $R_o$ is an n-hexyl group), and 250 mg of a CO2-philic surfactant is added directly to the surface of the substrate and allowed to sit for a period of 2 minutes. CO2 is then added to the chamber to a pressure of 250 bar for a period of 2 minutes after which the composition is flushed from the chamber with additional 5 chamber volumes of CO2 at constant pressure. Helium gas a 255 bar is then used to push the remaining CO2 out of the chamber after which the chamber is vented to yield a developed image of the original pattern.

The foregoing is illustrative of the present invention, and is not to be construed as limiting thereof. The invention is defined by the following claims, with equivalents of the claims to be included therein.

That which is claimed is:

1. A carbon dioxide solvent system comprising carbon dioxide having a quaternary ammonium salt dispersed therein,
   said quaternary ammonium salt selected from the group consisting of quaternary ammonium alkoxides, borates, cyanates and nitrates;
   and wherein said quaternary ammonium salt comprises at least one $CO_2$-philic group.

2. The composition of claim 1, wherein said quaternary ammonium salt has at least one $CO_2$-philic group coupled thereto.

3. The composition of claim 1, wherein said carbon dioxide solvent system is a liquid.

4. The composition of claim 1, wherein said carbon dioxide solvent system is a supereritical fluid.

5. The composition of claim 1, wherein said quaternary ammonium salt is a quaternary ammonium alkoxide.

6. The composition of claim 1, wherein said quaternary ammonium salt is a quaternary ammonium borate.

7. The composition of claim 1, wherein said quaternary ammonium salt is a quaternary ammonium cyanate.

8. The composition of claim 1, wherein said quaternary ammonium salt is a quaternary ammonium nitrate.

* * * * *

UNITED STATES PATENT AND TRADEMARK OFFICE
CERTIFICATE OF CORRECTION

PATENT NO.         : 7,410,751 B2  
APPLICATION NO.    : 11/045791  
DATED              : August 12, 2008  
INVENTOR(S)        : DeYoung et al.

Page 1 of 1

It is certified that error appears in the above-identified patent and that said Letters Patent is hereby corrected as shown below:

In the Claims:

Column 12, Claim 4, Line 55:  Please correct "is a supereritical fluid."
                              To read -- is a supercritical fluid. --

Signed and Sealed this

Twenty-first Day of October, 2008

JON W. DUDAS  
*Director of the United States Patent and Trademark Office*